(12) United States Patent
Sahrling

(10) Patent No.: US 7,441,215 B1
(45) Date of Patent: Oct. 21, 2008

(54) HIERARCHICAL NETLIST COMPARISON BY RELEVANT CIRCUIT ORDER

(76) Inventor: Mikael Sahrling, 67-1243 Kaomoloa Pl., Kamuela, HI (US) 96743

( * ) Notice: Subject to any disclaimer, the term of this patent is extended or adjusted under 35 U.S.C. 154(b) by 220 days.

(21) Appl. No.: 11/461,456

(22) Filed: Aug. 1, 2006

(51) Int. Cl.
  *G06F 17/50* (2006.01)
(52) U.S. Cl. ............................................. 716/5; 716/4
(58) Field of Classification Search ................ 716/4–6
  See application file for complete search history.

(56) References Cited

U.S. PATENT DOCUMENTS

| | | | |
|---|---|---|---|
| 5,243,538 A | 9/1993 | Okuzawa et al. | |
| 5,249,133 A | 9/1993 | Batra et al. | |
| 5,463,561 A | 10/1995 | Razdan et al. | |
| 5,787,006 A | 7/1998 | Chevallier et al. | |
| 5,790,416 A | 8/1998 | Norton et al. | |
| 6,009,251 A | 12/1999 | Ho et al. | |
| 6,009,252 A | 12/1999 | Lipton et al. | |
| 6,011,911 A | 1/2000 | Ho et al. | |
| 6,056,784 A | 5/2000 | Stanion | |
| 6,106,568 A * | 8/2000 | Beausang et al. | 716/18 |
| 6,115,546 A | 9/2000 | Chevalier et al. | |
| 6,289,491 B1 * | 9/2001 | Dupenloup | 716/5 |
| 6,336,206 B1 | 1/2002 | Lockyear | |
| 6,453,449 B1 | 9/2002 | Wada | |
| 6,505,323 B1 | 1/2003 | Lipton et al. | |
| 7,103,863 B2 * | 9/2006 | Riepe et al. | 716/7 |
| 7,162,703 B1 * | 1/2007 | Aik | 716/5 |

OTHER PUBLICATIONS

C. Ebeling "Gemini II, A Second generation layout verification program", IEEE ICCAD-88, Digest of Technical Papers. pp. 322-325, Nov. 7-10, 1988.
R.L. Spikelmier A.R. Newton, "WOMBAT a new netlist comparison program" IEEE Int. COnference on CAD, pp. 170-171, Sep. 1983.

* cited by examiner

*Primary Examiner*—Jack Chiang
*Assistant Examiner*—Binh C Tat (57) ABSTRACT

The present invention uses the strength of modern hierarchical integrated circuit design to speed up the comparison of two netlists. Instead of working from bottom-up it can proceed with arbitrary hierarchical order to do the comparison. This has the advantage that the subcircuits that are most interesting can be verified first and avoids the long wait to go through the hierarchy.

6 Claims, 15 Drawing Sheets

```
.subckt Adder vdd vss a b out
x1 vdd vss a b 10001 nor
x2 vdd vss a b 10002 nand
x3 vdd vss 10003 10002 out nor
mn1 10003 10001 vss vss nfet
mp1 10003 10001 vdd vdd pfet
.ends .subckt nand vdd vss a b out
mn1 c a vss vss nfet
mn2 out b c vss nfet
mp1 out a vdd vdd pfet
mp2 out b vdd vdd pfet
.ends .subckt nor vdd vss a b out
mn1 out a vss vss nfet
mn2 out b vss vss nfet
mp1 c a vdd vdd pfet
mp2 out b c vdd pfet
.ends
```

Figure 5

```
.subckt nor a b out vss vdd
mn1 out a vss vss nfet
mn2 out b vss vss nfet
mp1 c a vdd vdd pfet
mp2 out b c vdd pfet
.ends .subckt nand a b vdd vss out
mp1 out a vdd vdd pfet
mp2 out b vdd vdd pfet
mn1 c a vss vss nfet
mn2 out b c vss nfet
.ends .subckt Adder out a b vdd vss
x1 a b 301 vss vdd nor
x2 a b vdd vss 302 nand
x3 303 302 out vss vdd nor
mn1 303 301 vss vss nfet
mp1 303 301 vdd vdd pfet
.ends
```

Figure 6

```
;
; Checking subcircuit: Adder
;
; Reading netlists ...
; ... done
; Comparing subcircuit names and port names ...
; ... done
; Comparing devices/subcircuits Matching nodes vdd vdd
Matching nodes vss vss
Matching nodes a a
Matching nodes b b
Matching nodes c c
Matching nodes 10001 301
Matching nodes 10002 302
Matching nodes 10003 303

Matching subckts "nand" with label x1 and "nand" with label x1
Matching subckts "nor" with label x2 and "nor" with label x2
Matching subckts "nand" with label x3 and "nand" with label x3

; ... done

The netlists are logically equivalent
```

Figure 7

```
;
; Checking subcircuit: nor
;
; Reading netlists ...
; ... done
; Comparing subcircuit names and port names ...
; ... done
; Comparing devices/subcircuits Matching nodes vdd vdd
Matching nodes vss vss
Matching nodes out out
Matching nodes c c ; ... done The netlists are logically equivalent
```

Figure 8

```
;
; Checking subcircuit: nand
;
; Reading netlists ...
; ... done
; Comparing subcircuit names and port names ...
; ... done
; Comparing devices/subcircuit Matching nodes vdd vdd
Matching nodes vss vss
Matching nodes out out
Matching nodes c c ; ... done The netlists are logically equivalent
```

Figure 9

```
.subckt nor a b out vss vdd
mn1 out A vss vss nfet
mn2 out b vss vss nfet
mp1 c A vdd vdd pfet
mp2 out b c vdd pfet
.ends .subckt nand a b vdd vss out
mp1 out a vdd vdd pfet
mp2 out b vdd vdd pfet
mn1 c a vss vss nfet
mn2 out b c vss nfet
.ends .subckt Adder out a b vdd vss
x1 a b 301 vss vdd nor
x2 a b vdd vss 302 nand
x3 303 302 out vss vdd nor
mn1 303 301 vss vss nfet
mp1 303 301 vdd vdd pfet
.ends
```

Figure 10

```
;
; Checking subcircuit: Adder
;
; Reading netlists ...
; ... done
; Comparing subcircuit names and port names ...
; ... done
; Comparing devices/subcircuits Matching nodes vdd vdd
Matching nodes vss vss
Matching nodes a a
Matching nodes b b
Matching nodes c c
Matching nodes 10001 301
Matching nodes 10002 302
Matching nodes 10003 303

Matching subckts "nand" with label x1 and "nand" with label x1
Matching subckts "nor" with label x2 and "nor" with label x2
Matching subckts "nand" with label x3 and "nand" with label x3

; ... done

The netlists are logically equivalent
```

Figure 11

```
;
; Checking subcircuit: nor
;
; Reading netlists ...
; ... done
; Comparing subcircuit names and port names ...
; ... done
; Comparing devices/subcircuits Matching nodes vdd vdd
Matching nodes vss vss
Matching nodes out out
Matching nodes c c
        The node "a" in Netlist3 has a unique topology
            It connects only to the subckt I/O ports
        There is no corresponding node in Netlist1

The node "A" in Netlist3 has a unique topologu
            It connects to one pfet and one nfet
        There is no corresponding node in Netlist1

; ... done

The netlists are NOT logically equivalent
```

Figure 12

```
;
; Checking subcircuit: nand
;
; Reading netlists ...
; ... done
; Comparing subcircuit names and port names ...
; ... done
; Comparing devices/subcircuit Matching nodes vdd vdd
Matching nodes vss vss
Matching nodes out out
Matching nodes c c ; ... done The netlists are logically equivalent
```

Figure 13

HIERARCHICAL NETLIST COMPARISON BY RELEVANT CIRCUIT ORDER

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF THE INNOVATION

1. Field of Invention

The present invention relates to the field of verifying two or more designs of circuits to determine if the devices and interconnections found in one design appear in the same way in the other designs.

2. Prior Art

Figure 1A:
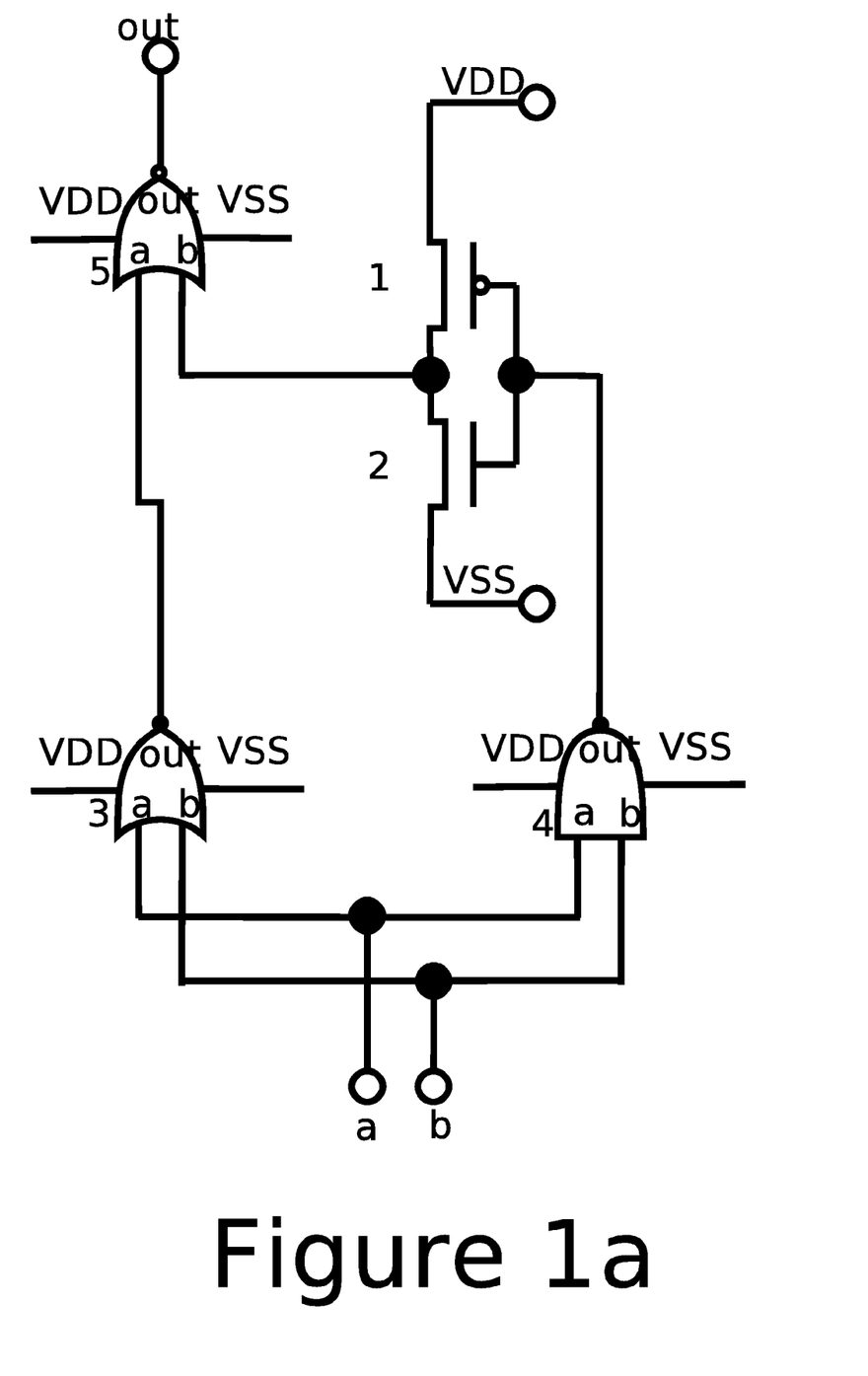
FIGS. 1a-c. shows a schematic design.
Figure 1B:
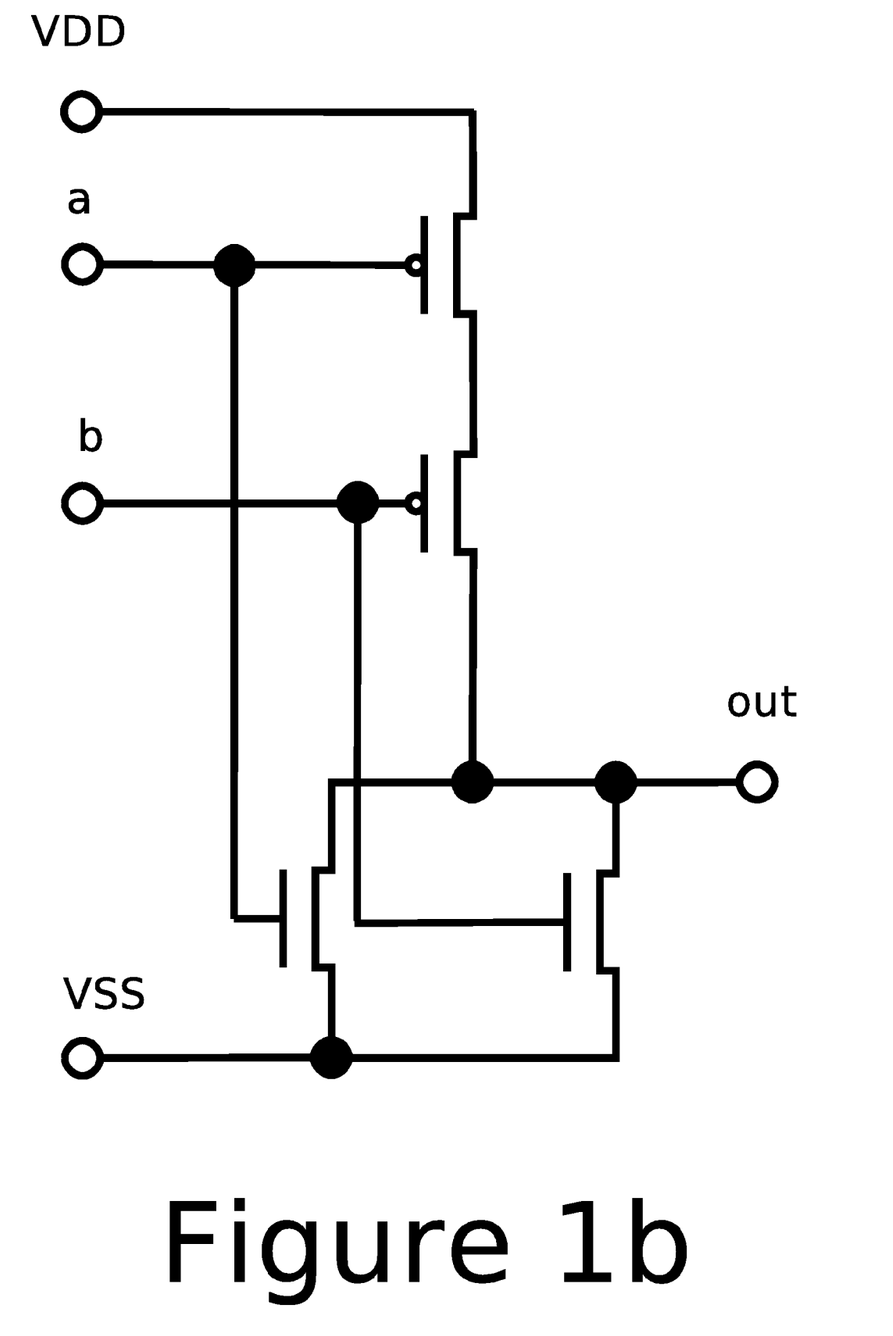
Figure 1C:
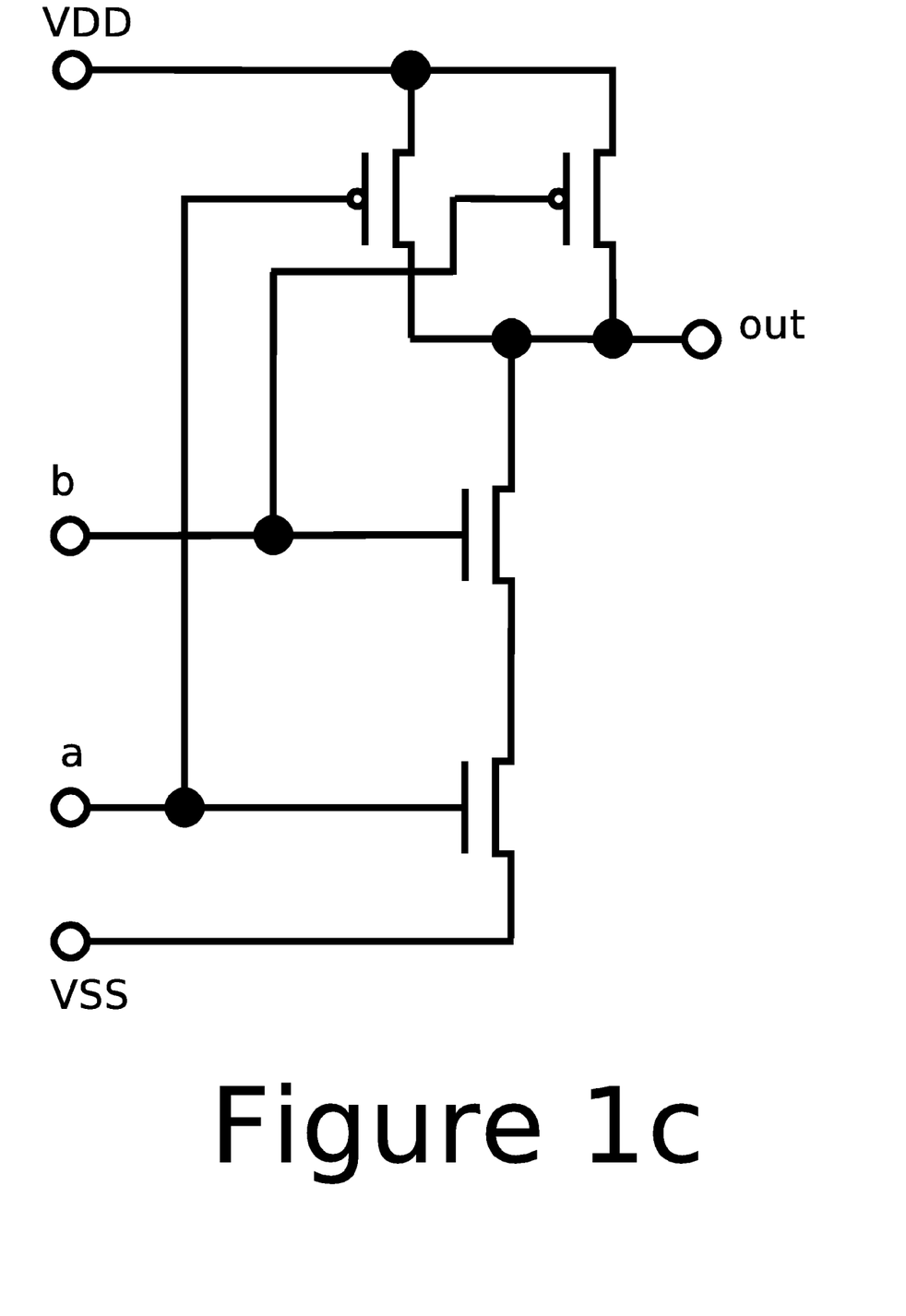

When designing an electric circuit it is customary to start with an abstract logic design called a schematic. This will identify the logic components and interconnects necessary to provide the desired functionality. An example of this can be found in FIG. 1a, where five logic components, 1, 2, 3, 4, 5, two input ports, a, b, one output port out, power supply VDD and ground connection VSS are shown. The interconnects between the components and between the components and the ports are represented with the wires in FIG. 1a. To avoid too much clutter the power supply and ground connections are symbolized with labels on top of short wire segments. Components 1, 2 in FIG. 1a represent fundamental logic devices called CMOS pfet and nfet transistors. The schematic of components 3 and 5, also known as a nor-gate, is shown in FIG. 1b. FIG. 1c shows the schematic of component 2, commonly referred to as a nand-gate. A component that is not a fundamental device but instead contains such devices or other components, see FIGS. 1b,c, is referred to as a subcircuit. The schematic in FIG. 1a is known as the top-level design, since it is not a subcircuit of any of the other schematics in FIGS. 1b,c. Modern circuit design has many other fundamental devices available, such as bipolar transistors, inductors, capacitors, resistors among others. The basic CMOS devices described here is for simplicity and illustrative purposes only and the discussion shall in no way be interpreted as limited to a particular set of devices.

Figure 2:
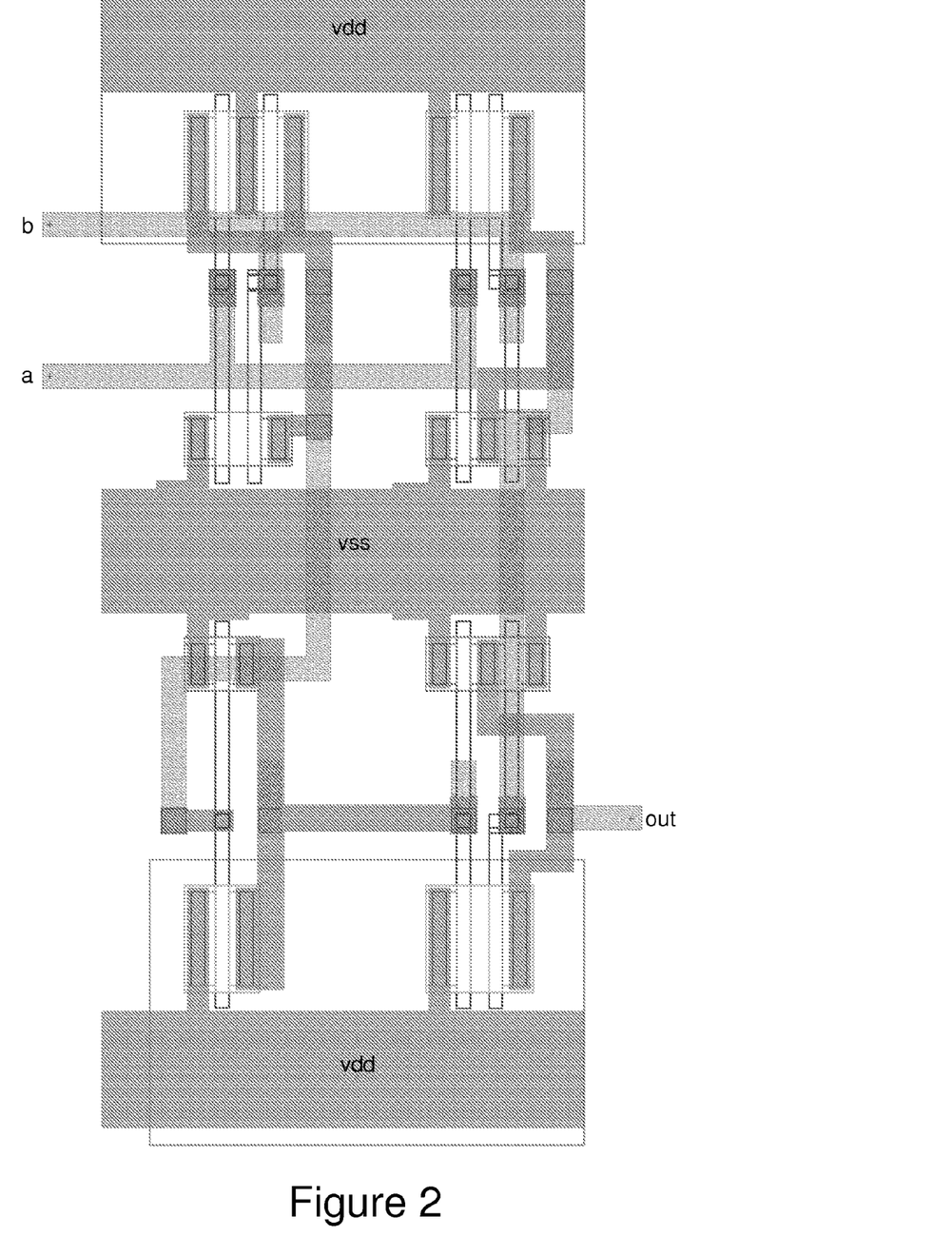

After the logic design is finished it is translated into a layout, which describes layer by layer how the design is to be built on a piece of silicon or printed circuit board or other such materials. FIG. 2 shows an example of a layout corresponding to the schematic in FIG. 1a. The layout consists of three subcircuits and CMOS nfet and pfet transistors corresponding to components 1-5 in FIG. 1a. The interconnections between the components can also be seen in FIG. 2.

Figure 5:
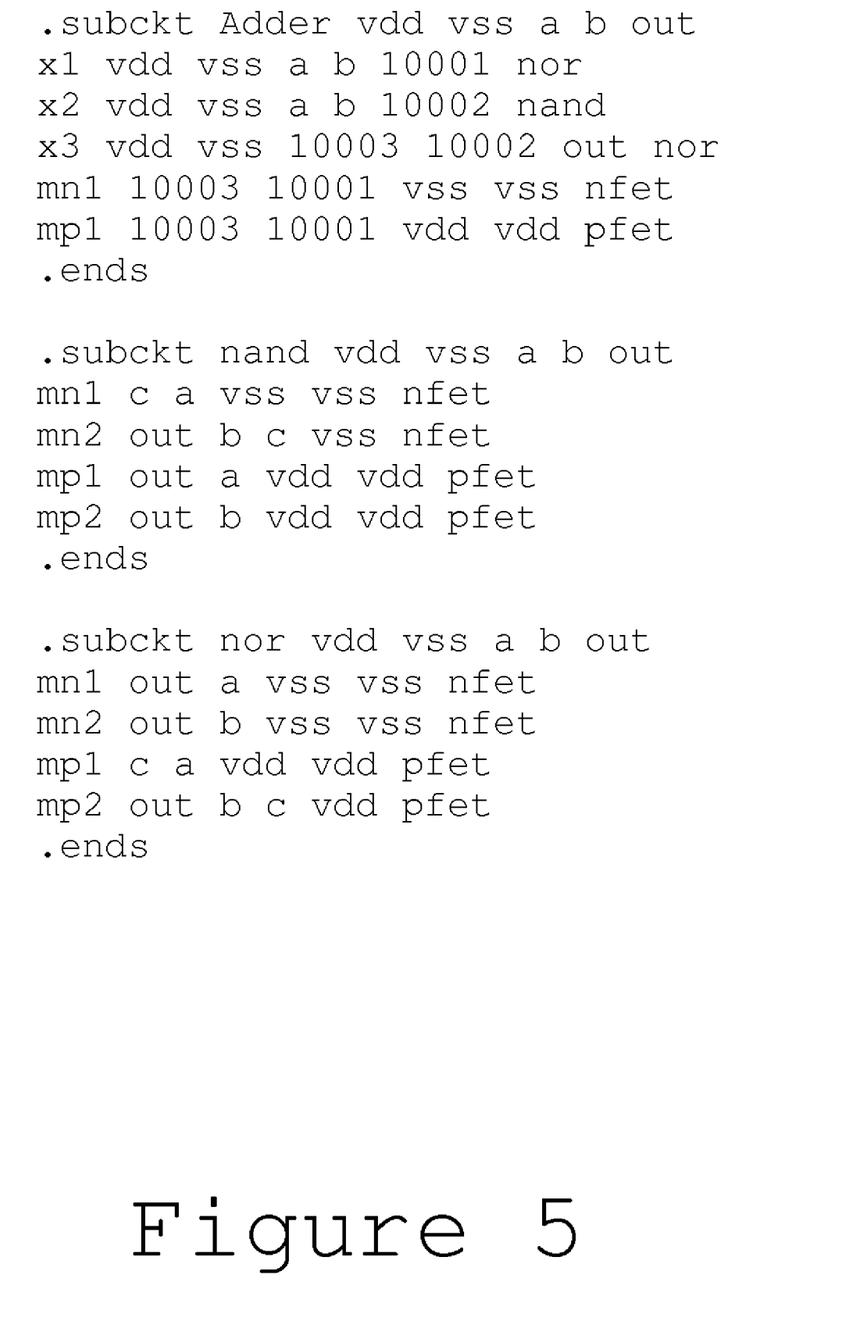
FIG. 5. is a netlist containing three subcircuits, referred to as netlist1.

Both the schematic and layout can furthermore be described by what is called a netlist. It is a list of subcircuits and their constituting components. Interconnections, called nets or nodes, are symbolized with identical names appearing at the appropriate ports of the connected components. FIG. 5 shows an example of a netlist. It contains three separate subcircuits, "Adder", "nor", and "nand", where "Adder" is the netlist of the schematic in FIG. 1a. The "nor" and "nand" netlists correspond to the schematics in FIGS. 1 b,c. In the "Adder" subcircuit there are copies, or instantiations, of the "nor" and "nand" subcircuits. As FIG. 5 illustrates, the netlist typically consists of many separate subcircuits, where each subcircuit is represented by a name and a list of input and output ports. These ports represent the connections between the inside of the subcircuit and the outside environment. A subcircuit furthermore consists of a list of electronic devices such as transistors, resistors, capacitors and other such fundamental devices and their interconnections. A subcircuit can also consist of other subcircuits (i.e. instantiations of other subcircuits), see "Adder" in FIG. 5. Thereby one can create a hierarchical structure where the lowest level subcircuits consist of fundamental devices only, see "nor" and "nand" in FIG. 5. The top-level hierarchy is the highest hierarchy level of interest.

The layout netlist and schematic netlist now needs to be verified for logical equivalence, so that each component in the schematic netlist has a corresponding one in the layout with the same interconnects to the other components. This verification procedure is what we are concerned with in this invention. There are other situations where a similar logical netlist verification is necessary. It is, for example, often useful to copy a design made in one technology, say 0.13 um CMOS to another technology such as 0.09 um CMOS. It is then again necessary to verify that the two schematic representations are logically equivalent.

To solve the problem of comparing different netlists, inventors have over the years followed two different paths. Initially all netlists were flattened, a process in which all subcircuit instantiations are removed and replaced by their fundamental device contents. There are many published and otherwise known ways to solve this problem commonly referred to as graph isomorphic methods, see for example articles by C. Ebeling "Gemini II, A second generation layout verification program", IEEE ICCAD-88, Digest of Technical Papers. pp. 322-325, Nov. 7-10 1988 and R. L. Spickelmier and A. R. Newton, "WOMBAT a new netlist comparison program" IEEE Int. Conference on CAD, pages 170-171, September 1983. As the design complexity grew it became necessary to take advantage of the hierarchical description of the circuit and several methods appeared.

The invention by Razdan, U.S. Pat. No. 5,463,561 to Razdan entitled "High Capacity netlist comparison", concerns designs consisting of mosfet devices only and describes a method of simplifying the circuit and thereby reducing the complexity when verifying logical equivalence.

The method of Okuzawa et al, U.S. Pat. No. 5,243,538 to Okuzawa et al. entitled "Comparison and verification for logic circuits and verification thereof", is of great use when verifying complex digital designs and is not very suitable for more general designs.

Ho et al., U.S. Pat. No. 6,009,251 entitled "Method and system for layout verification of an integrated circuit design with reusable sub designs", describes a method where if you are using the same design multiple times there is no need to reverify its logical equivalence again and again. Unfortunately, there is always a need to reverify a design because of the high risk of database corruption and in practice the method is not used much.

Lipton et al's invention, U.S. Pat. No. 6,505,323 entitled "Methods apparatus and computer programs products that perform layout versus schematic comparison of integrated circuit memory devices using bit cell detection and depth first searching techniques", is concerned with the special case where there is a lot of redundancy in the designs, such as memory circuits, and how one can arrange the analysis in such a way as to reduce the time spent resolving such redundancies.

The invention by Batra, U.S. Pat. No. 5,249,133 entitled "Methods for the hierarchical comparison of schematic and layout of electrical components", is more general in nature and of more interest to the present discussion. It is also a methodology used by many commercial tools. The basic idea in Batra's method is to order all subcircuits, in a given design, in hierarchical order and start the verification at the lowest hierarchical level and work upwards in the hierarchy until reaching the top-level. This ordering is necessary since it is assumed nothing is known about the subcircuits and their ports. For each subcircuit one has to find a one to one correspondence between each subcircuit port in the netlists. Once this is known one can use this information for all instantiations of this subcircuit and the verification can proceed to the next level in the hierarchy. There are several disadvantages with this approach:
  (a) The subcircuits need to be ordered from the lowest to the highest hierarchy level.
  (b) The verification procedure is necessarily also from the lowest hierarchy to the top-level hierarchy.
  (c) If one is working on the top-level layout design and wants to have it verified one has to wait for all lower level subcircuits to be verified before one can get the desired result.
  (d) One has to keep track of the subcircuit port map from netlist to netlist. This cost both memory space and computational overhead.

The invention by Riepe et al., U.S. Pat. No. 7,103,863 entitled "Representing the design of a sub-module in a hierarchical integrated circuit design and analysis system", concerns itself with other aspects of the layout verification process such as timing verification of the integrated circuit. The basic idea is that one can remove from the circuit such part that do not contribute to the timing delay thus achieving a sometimes significant increase in verification speed. The invention cannot be used for verifying logical equivalence, the problem the present invention solves.

The invention by Aik, Eric Teh Gim, U.S. Pat. No. 7,162,703 entitled "Electrical design rule checking expert traverser system", describes an invention for checking design rules associated with nodes or a plurality of nodes in particular netlist. This can help in catching design "errors", such as floating gates, early in the design phase. It thus solves a different problem than the present invention.

The invention by Dupenloup, Guy, U.S. Pat. No. 6,289,491 entitled "Netlist analysis tool by degree of conformity", describes an invention that analyzes a particular netlist, its hardware elements, characteristics and interconnections and how this conforms to predetermined properties. For example, it can discover if a netlist generated from an RTL description supports the appropriate clocking scheme. It thus concerns itself with characteristics internal to a particular netlist and not logical equivalence of two different netlists.

The invention by Beausang et al., U.S. Pat. No. 6,106,568 entitled "Hierarchical scan architecture for design for test applications" discusses a method for architecting design for test circuitry. In modern integrated circuits, in particular ones that are dominated by digital circuitry with tens of millions of digital gates, methods for testing functionality of individual elements such as register blocks, is very important. Beausang describes a method that can among other things detect design-for-test structures already in place in a particular subcircuit. It thus is concerned with characteristics internal to a particular netlist and not the logical equivalence of two different netlists.

BACKGROUND OF INVENTION

Objects and Advantages

Designs prepared today are of much higher complexity than those prepared just a few years ago. Nowadays, with System-On-Chip (SOC) comprising of millions of transistors and many thousands of subcircuits, it has become necessary to build up the hierarchical designs such that subcircuits with the same name in both schematic and layout also has the same port names. Modern tools such as automated Place/Route and semi automatic placement tools like Cadence Virtuoso-XL, all ensure the port names are the same between a layout and a schematic. This also greatly facilitates debugging of the design in the extraction phase, where unwanted so-called parasitic components influence the circuit performance.

This invention takes advantage of this modern way of labeling ports the same in both layout and schematic. Initially, it is assumed that ports with the same name correspond to each other logically and therefore comparing instantiations of a particular subcircuit can proceed before the subcircuit itself is verified. When each subcircuit is verified this assumption is checked and any error reported. This has several advantages:
  (a) Ordering of subcircuits in the hierarchy is no longer necessary since the verification can proceed from any level of hierarchy.
  (b) The verification can proceed in any order, for example top-down.
  (c) The debugging of subcircuits can be done in parallel with the verification process, since the most relevant subcircuit is verified first, with additional gains in time spent debugging.
  (d) There is no need to keep track of subcircuit port name maps.

Modern layout proceeds using a bottom-up strategy where the lowest order subcircuits that contain no other subcircuits are made first. This is necessary since before building the higher levels of the design the size and port locations of the lower hierarchical designs must be known. Thus, as the layout proceeds it is generally the subcircuit at the highest hierarchy level that has not been verified while its constituting subcircuits have already been built and verified for logical interconnect.

This invention greatly speeds up the debugging process by verifying the logical interconnect of the most relevant circuit first. This way, the user can debug those circuits while the less relevant circuits are being verified. With the old bottom-up approach there is a lengthy wait for all subcircuits to be verified before starting on the top-level. In most cases these subcircuits are already likely to be logically equivalent since they have been built and verified at an earlier stage, and the confirmation is of less interest.

SUMMARY

An invention is presented which compares two netlists hierarchically. A greater efficiency compared to earlier methods is achieved by taking advantage of the modern way of ensuring the port names of all subcircuits are identical between schematic/layout. The order with which the subcircuits are verified can then be defined arbitrarily and the most relevant subcircuits can be verified immediately, avoiding lengthy wait for less relevant subcircuits to be verified.

DRAWINGS

Figures

FIG. 2. illustrates an example of a layout of FIG. 1a.

DETAILED DESCRIPTION OF THE INVENTION

General System Configuration

Figure 4:
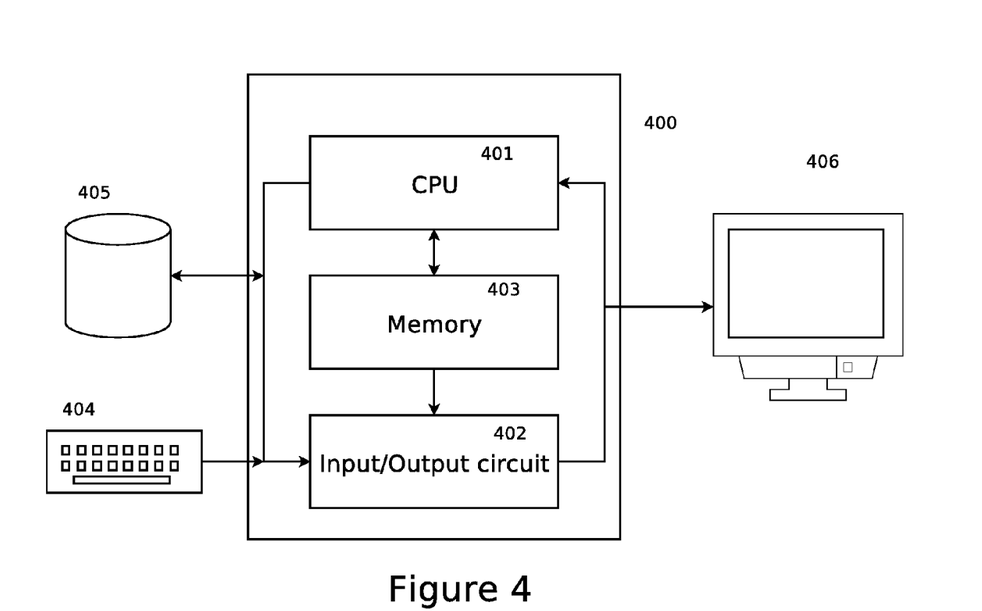
FIG. 4. is a typical computer system used to implement the invention.

A typical computer system used to implement the process described herein can be found in FIG. 4. It consists of a computer core 400 and peripheral units 404, 405, and 406. The computer core itself 400 is made up of a central processing unit (CPU) 401, an input/output circuit 402 to handle communication between all parts of the computer system, and a memory 403 for storing intermediate computational results. All these elements are intended to be representative of a broad category of data processors, such as Personal Computers (PC's), mini computers and super computers to name a few.

The peripheral unit 404 is intended to represent an input device, here depicted as a keyboard connected to the computer cores input/output circuit. It can, of course, be anything from a keyboard and cursor control (mouse) to magnetic devices such as hard drives/tape drives and other such well-known devices. The peripheral unit 405 is intended to represent external mass memory storage such as magnetic hard drives/tape drives, electronic memory and other familiar devices. The remaining peripheral unit 406 is a display for communicating with a user and can be a monitor, printer or other similar devices.

DETAILED DESCRIPTION OF THE INVENTION

Process description

Figure 3:
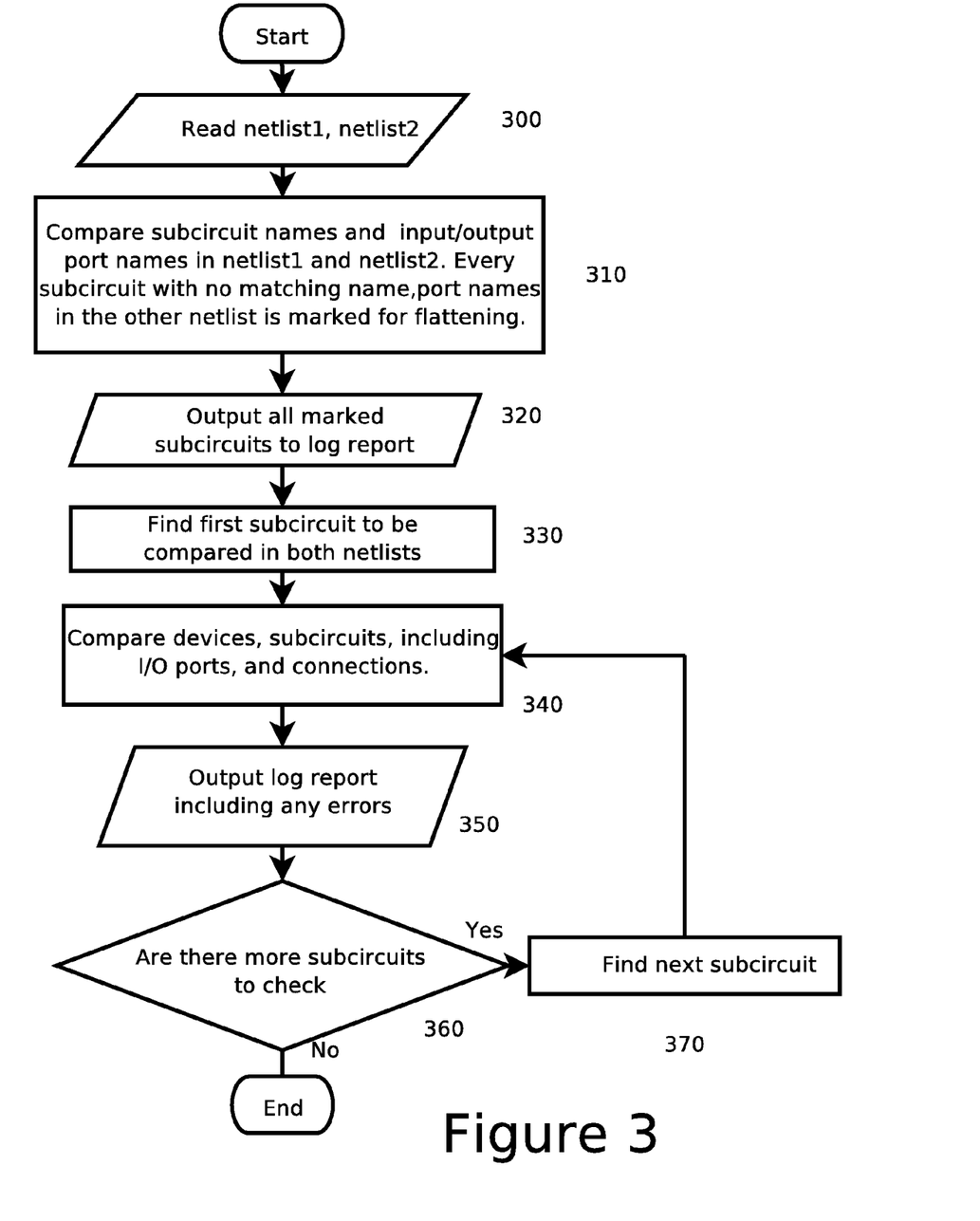
FIG. 3. shows a flow chart of the invention.

FIG. 3 shows a flow chart with the steps involved in this invention. A plurality of netlists is read into the computer system by any means available 300. For clarity we will refer to the case of comparing two netlists, netlist1 and netlist2 300. These netlists are initially compared to find subcircuits with the same name 310. For each of these subcircuits the input and output port names are compared 310. If both the circuit name and port names are the same the subcircuit is left unmarked. If the port names do not correspond the particular subcircuit is marked for flattening, where all subcircuit hierarchy is expanded and the subcircuit is replaced by its fundamental devices. All subcircuits in both netlists unique to a particular netlist are also marked for flattening. All marked subcircuits are output to a log report for possible corrective actions by the user 320. At this point one has several ways to proceed. I presently prefer to start the comparison at the circuit top-level since that is normally the most recently laid out, and work down the hierarchy to the lowest levels 330. There are other possibilities such as sorting the subcircuits in complexity level and starting with either the most complex or the least complex subcircuit. One can also let the user decide the order through an additional input file. To compare the subcircuits, one can use any graph isomorphism technique 340. When an instantiation of a particular unmarked subcircuit is encountered, the assumption is made that ports with the same name are electrically equivalent. This assumption will be checked when the subcircuit itself is verified by including the ports explicitly in the netlist. An error report is printed to the output device 350. This process continues until all subcircuits in the design are compared 360, 370.

The advantage of this procedure is that it leaves much more freedom for the user to do the comparison. The user simply starts the verification with the most interesting subcircuit and as soon as the result is available the debugging can start, even while the process continues the verification of the rest of the circuits. This way, one can increase the overall efficiency of the debugging process.

Figure 6:
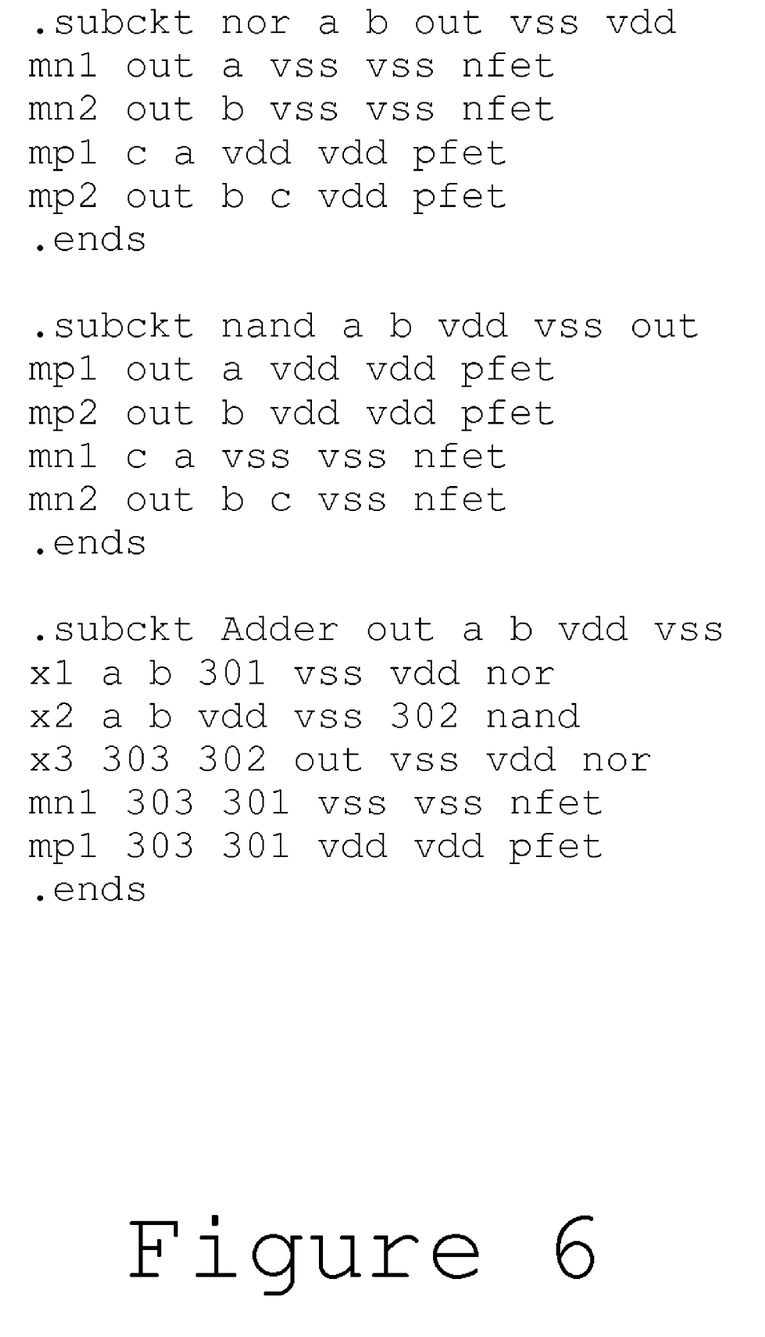
FIG. 6. is a netlist containing three subcircuits, referred to as netlist2.
Figure 7:
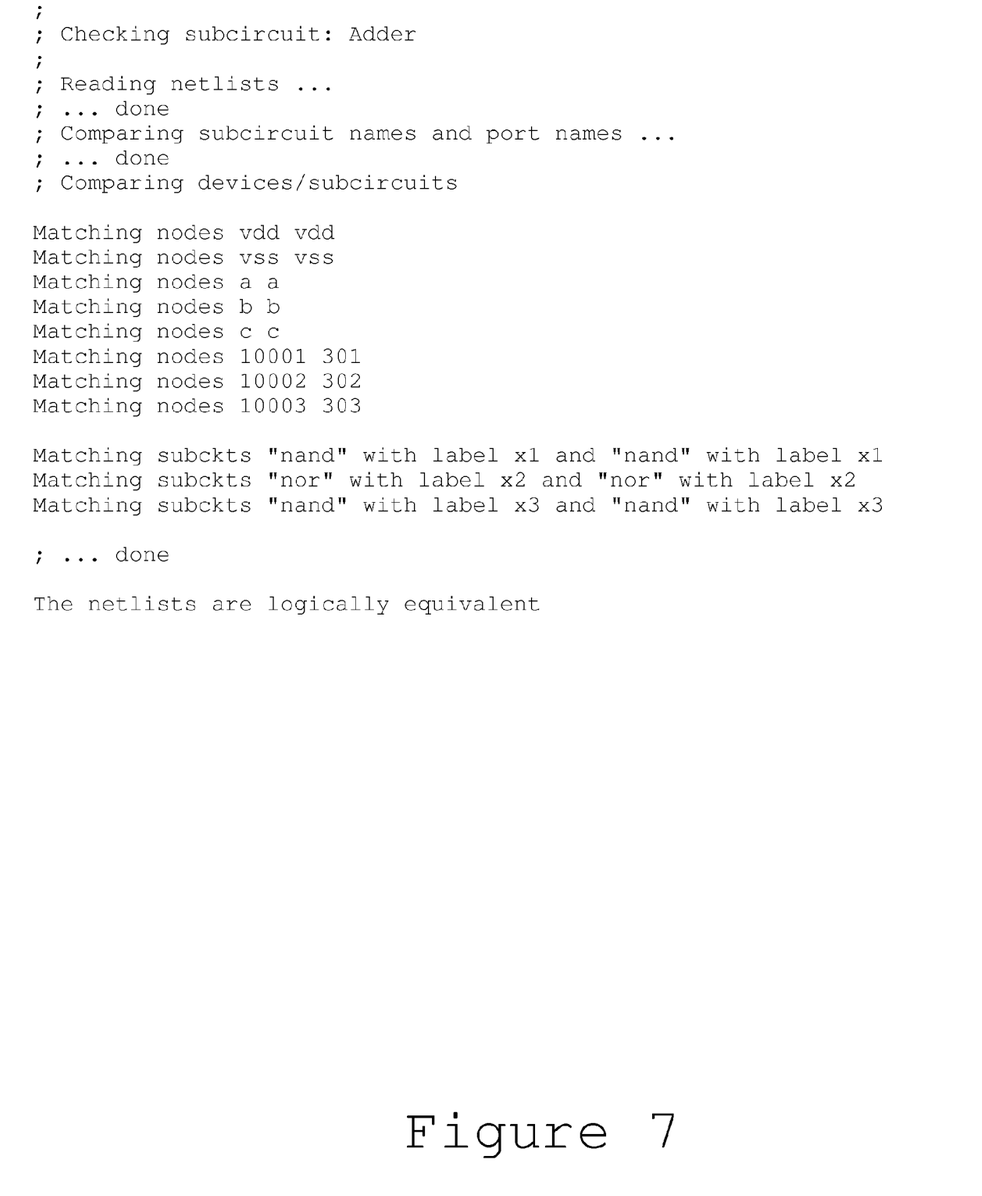
FIG. 7. shows a typical output of a comparison between subcircuit "Adder" in netlist1 and netlist2.
Figure 8:
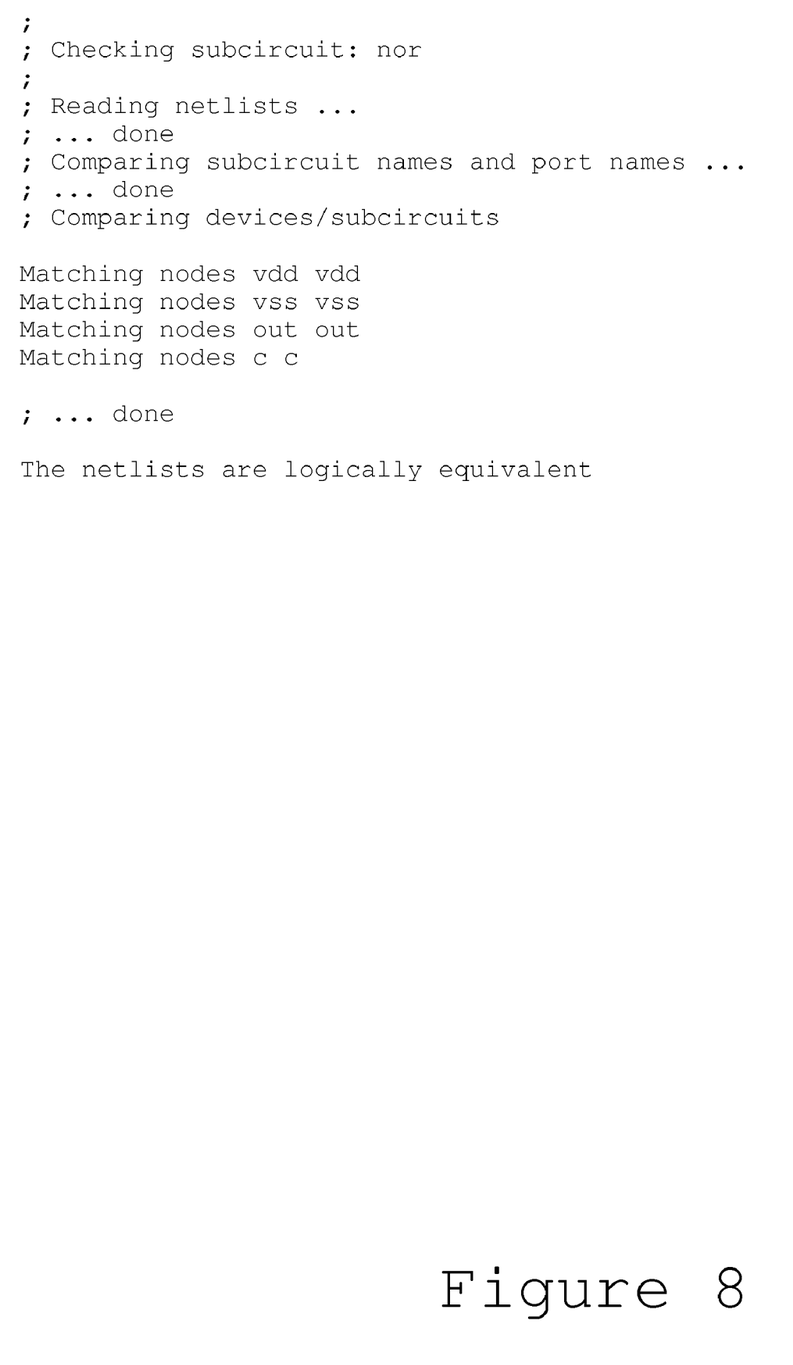
FIG. 8. shows a typical output of a comparison between subcircuit "nor" in netlist1 and netlist2.
Figure 9:
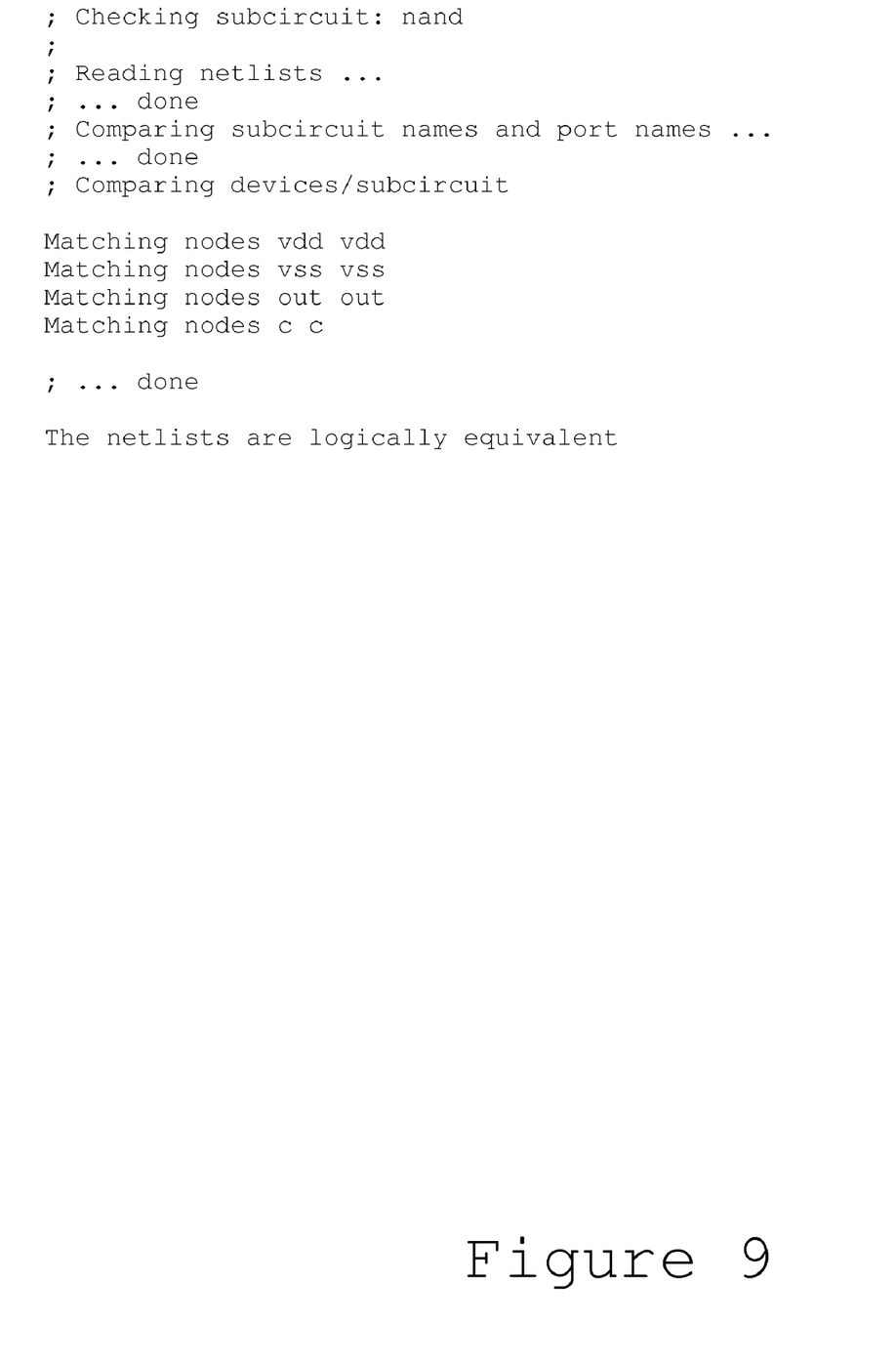
FIG. 9. shows a typical output of a comparison between subcircuit "nand" in netlist1 and netlist2.

To further illustrate the present invention, let us examine the netlists shown in FIGS. 5 and 6. FIG. 5 describes netlist1 and it contains three subcircuits "Adder", "nand", and "nor". The top-level subcircuit "Adder" contains three subcircuit instantiations of "nor" and "nand", labeled x1-x3, and two transistors, mn1, mp1. The subcircuits "nand", "nor" are defined following the top-level subcircuit. FIG. 6 likewise describes netlist2 but here the order of the subcircuit definitions is reversed compared to FIG. 5 to illustrate the insignificance of the order of definitions. To compare these two netlists all three subcircuit definitions in FIGS. 5, 6 will be investigated for name and port name equivalence and compared separately. We see that the subcircuit "Adder" exists in both netlists and the port definitions are the same although the port order is different, this has no effect. The present invention will just look at the existence of the same port name in both subcircuit definitions not their place in the subcircuit header. The other two subcircuits likewise have both a name correspondence and port name correspondence between the two circuits. The procedure now compares the top-level subcircuit using a graph isomorphism algorithm. There are many known ones and anyone will work. As can be seen from a careful investigation of the "Adder" circuit the two netlists correspond and an output is produced as in FIG. 7. After this, the procedure looks at subcircuit "nor" and compares the two netlist definitions. They are again equivalent and the output is in FIG. 8. The comparison of the last subcircuit "nand" can be found in FIG. 9.

This is, of course, an example used for illustrative purposes only and a more realistic situation will have hundreds/thousands of subcircuit definitions that reflect the complexity of modern day integrated circuit design.

Figure 10:
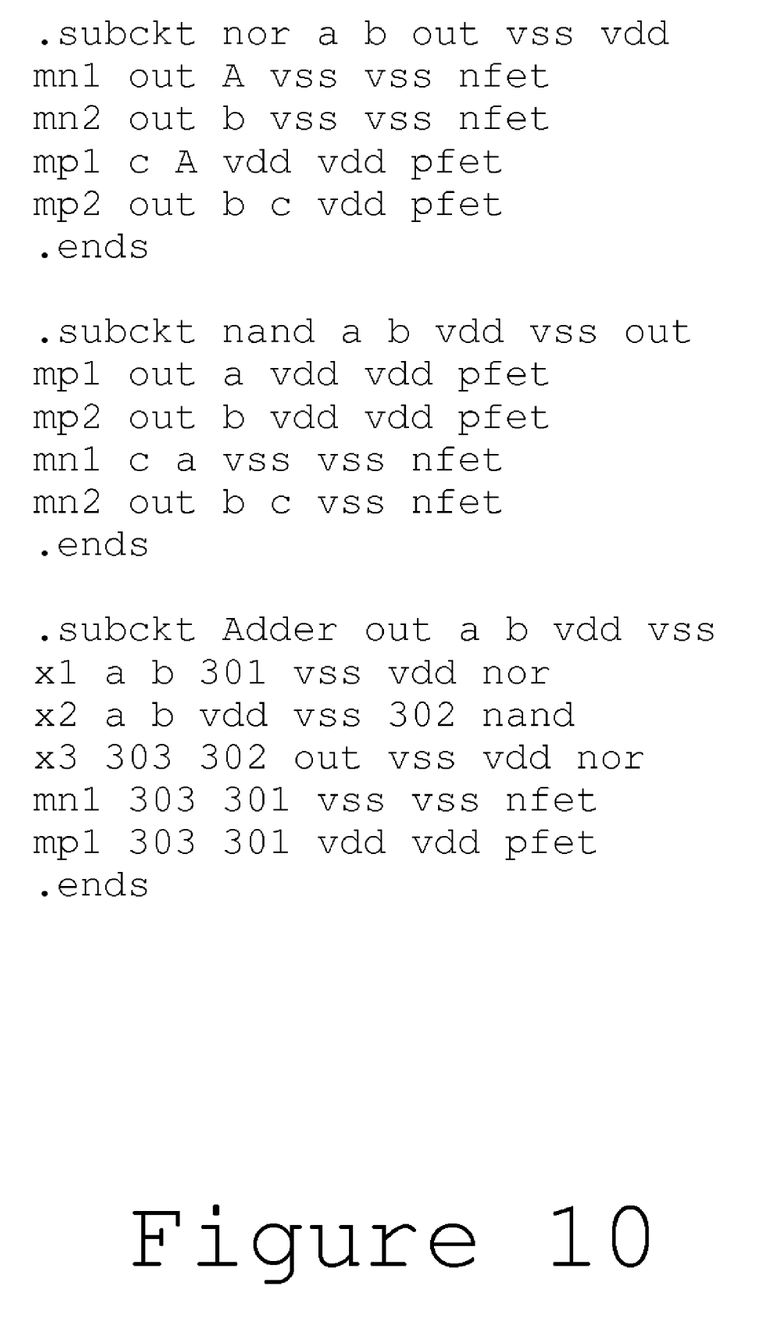
FIG. 10. is a netlist containing three subcircuits, referred to as netlist3.

It is now interesting to see how this invention handles situations where there are errors. First, let us see what happens when a port is not connected properly as in the netlist found in FIG. 10. Here the definition of the "nor" circuit is similar in the subcircuit header but internally there is no connection to port "a". Instead the internal node "A" should have been labeled "a" for the equivalence to be established.

Figure 11:
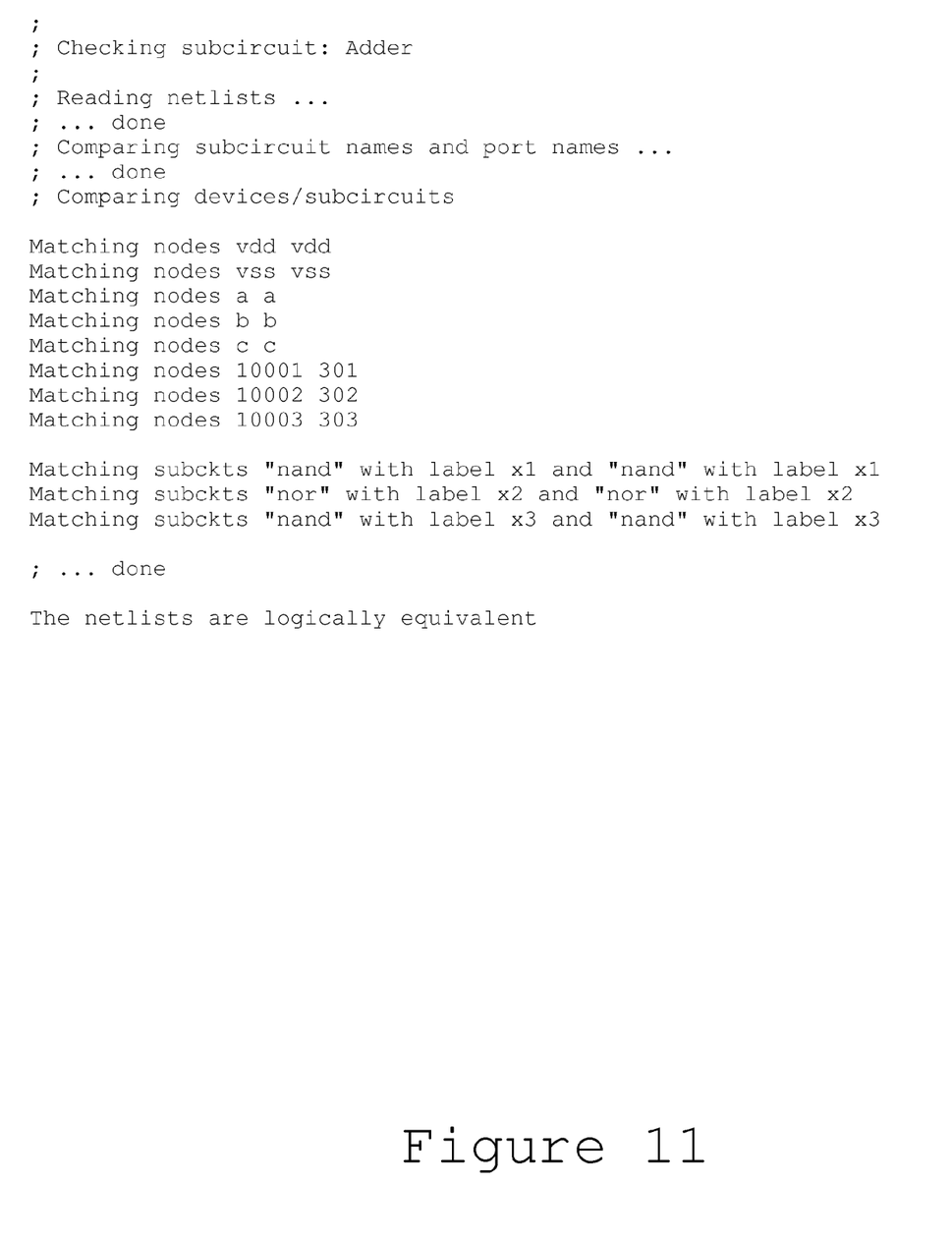
FIG. 11. shows a typical output of a comparison between subcircuit "Adder" in netlist1 and netlist3.
Figure 12:
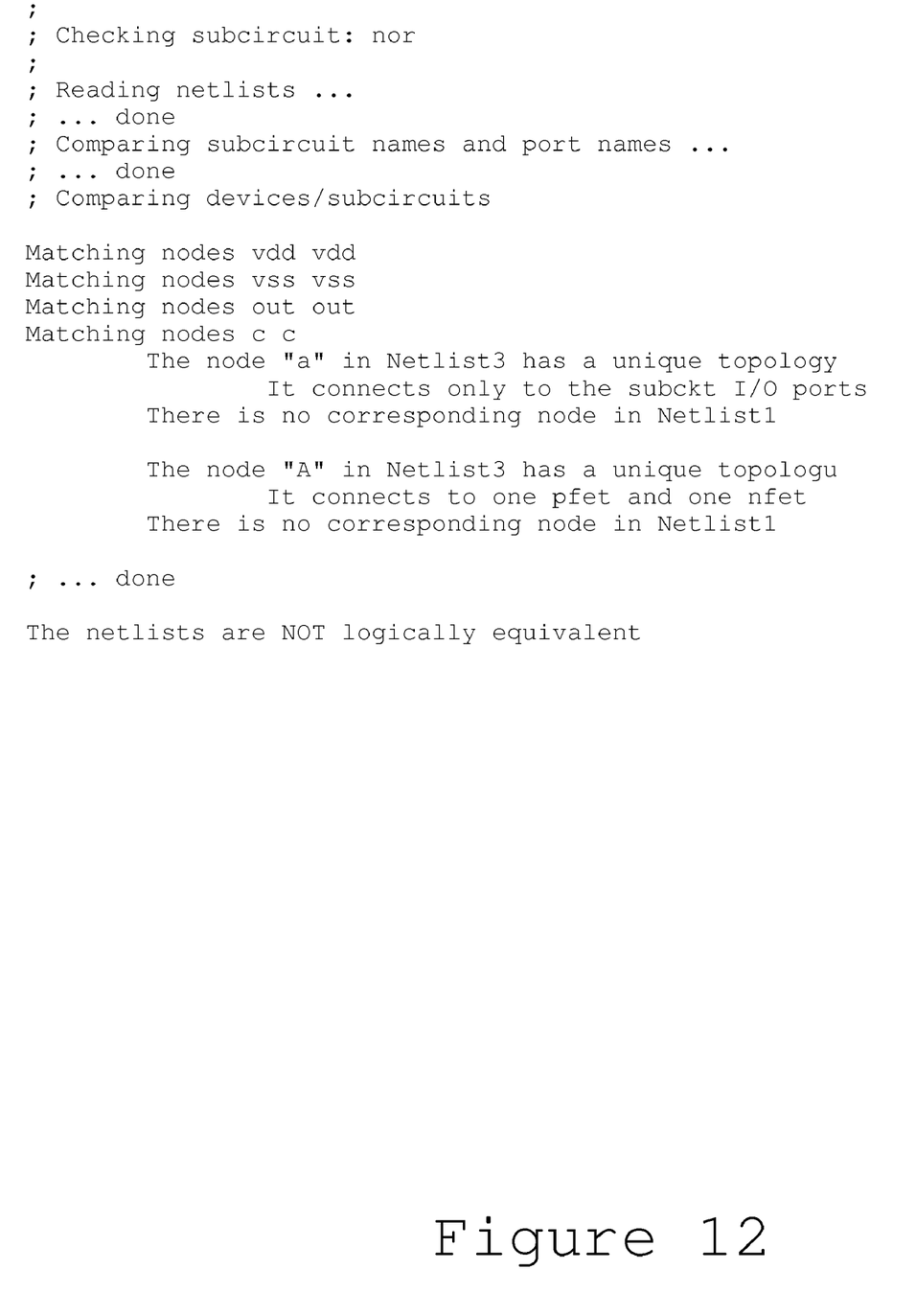
FIG. 12. shows a typical output of a comparison between subcircuit "nor" in netlist1 and netlist3.
Figure 13:
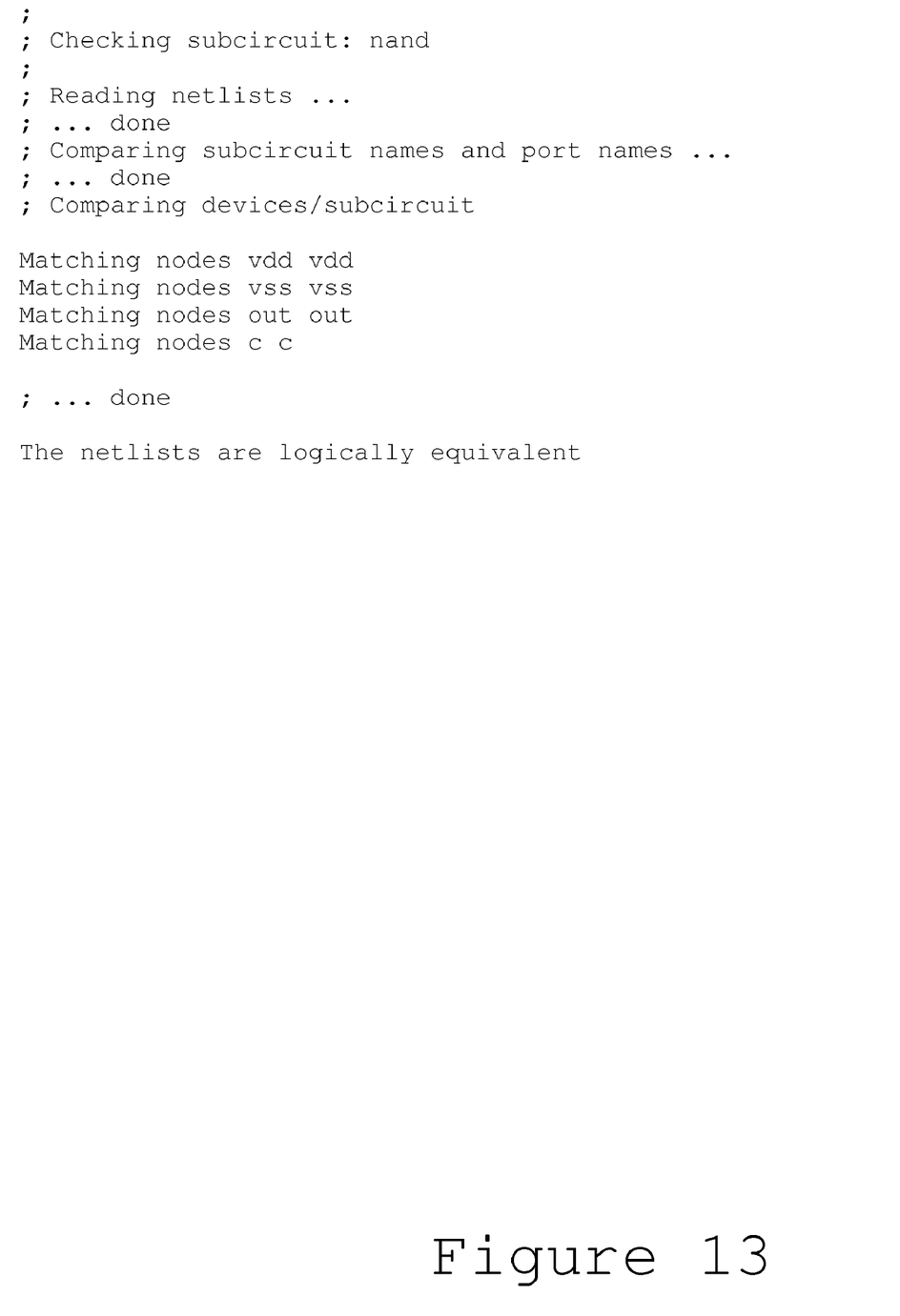
FIG. 13. shows a typical output of a comparison between subcircuit "nand" in netlist1 and netlist3.

The invention under consideration will proceed just as in the previous example for the top-level "Adder", see FIG. 11, and "nand", see FIG. 13. They are connected equivalently in both netlists and they pass the verification correctly. When it comes to compare the two "nor" circuits the connection to port "a" is not there as can be seen by the error report in FIG. 12. The report indicates that port "a" is not connected to anything internal to the subcircuit and the internal node "A" has no corresponding one in netlist1. Thus, this circuit fails the comparison, as it should.

These are just simple examples and there should be no trouble realizing this general methodology will work for any depth of hierarchy and complexity.

Although the description above contains many specificities, these should not be construed as limiting the scope of the invention but as merely providing illustrations of some of the presently preferred embodiments of this invention. It is furthermore clear that many alternatives, modifications, variations, and uses will be apparent to those skilled in the art in light of the foregoing discussion. The scope of the invention should be determined by the appended claims and the legal equivalents, rather than by the examples given.

The invention claimed is:

1. A method of comparing a plurality of circuit designs, said circuit designs each being described by a netlist, said netlist specifying logical devices and their interconnections, said devices being organized into a plurality of subcircuits, said subcircuits having a list of input/output port names, said subcircuits being specified by a name, said subcircuits being organized in a hierarchical order where subcircuits of a higher hierarchical order contain instantiations of subcircuits of lower hierarchical order and said devices, said method comprising:
   (a) reading said netlists;
   (b) finding subcircuits in said netlists that have the same name and same list of input/output port names;
   (c) leaving such subcircuits unmarked, all other subcircuits being marked;
   (d) starting the comparison with the most relevant unmarked subcircuit, wherein starting the comparison with the most relevant subcircuit comprises starting from a top-level subcircuit, said top-level being the highest hierarchical level of interest;
   (e) flattening any instantiation of marked subcircuits to devices in said subcircuit;
   (f) verifying logical equivalence of said subcircuit using a graph isomorphism technique;
       (1) assuming instantiations of unmarked subcircuits in said subcircuit are such that the same port name is connected identically inside said unmarked subcircuits in said netlists;
       (2) verifying each port name in said subcircuit is connected to the same devices and subcircuit instantiations in an identical way in said netlists validating said assumption;
   (g) finding the next unmarked subcircuit to compare;
   (h) continuing until all unmarked subcircuits of interest have been compared;
wherein a circuit design is compared in the most relevant order in minimal time.

2. The method of comparing a plurality of circuit designs as set forth in claim 1, wherein finding the next unmarked subcircuit to compare comprises going down the hierarchy from said top-level.

3. The method of comparing a plurality of circuit designs as set forth in claim 1, wherein continuing until all unmarked subcircuits of interest have been compared comprises reaching the bottom level of the hierarchy in said netlists.

4. An apparatus for comparing a plurality of circuit designs, said circuit designs each being described by a netlist, said netlist specifying logical devices and their interconnections, said devices being organized into a plurality of subcircuits, said subcircuits having a list of input/output port names, said subcircuits being specified by a name, said subcircuits being organized in a hierarchical order where subcircuits of a higher hierarchical order contain instantiations of subcircuits of lower hierarchical order and said devices, said apparatus comprising a Central Processing Unit memory and input/output means, said apparatus further comprising:
   (a) input means for reading said netlists;
   (b) means for finding subcircuits in said netlists that have the same name and same list of input/output port names;
   (c) means for leaving such subcircuits unmarked, all other subcircuits being marked;
   (d) means for starting the comparison with the most relevant unmarked subcircuit, wherein means for starting the comparison with the most relevant subcircuit comprises means for starting from a top-level subcircuit, said top-level being the highest hierarchical level of interest;
   (e) means for flattening any instantiation of marked subcircuits to devices in said subcircuit;
   (f) means for verifying logical equivalence of said subcircuit using a graph isomorphism technique;
       (1) assuming instantiations of unmarked subcircuits in said subcircuit are such that the same port name is connected identically inside said unmarked subcircuits in said netlists;
       (2) verifying each port name in said subcircuit is connected to the same devices and subcircuit instantiations in an identical way in said netlists validating said assumption;
   (g) means for finding the next unmarked subcircuit to compare;
   (h) means for continuing until all unmarked subcircuits of interest have been compared,
wherein a circuit design is verified in the most relevant order in minimal time.

5. The apparatus for comparing a plurality of circuit designs as set forth in claim 4, wherein means for finding the next unmarked subcircuit to compare comprises means for going down the hierarchy from said top level.

6. The method of comparing a plurality of circuit designs as set forth in claim 4, wherein means for continuing until all unmarked subcircuits of interest have been compared comprises means for reaching the bottom level of the hierarchy in said netlists.

* * * * *